United States Patent [19]

Kashimura

[11] Patent Number: 5,274,590
[45] Date of Patent: Dec. 28, 1993

[54] READ ONLY MEMORY DEVICE WITH RECHARGING TRANSISTOR AUTOMATICALLY SUPPLEMENTING CURRENT TO AN INPUT NODE OF OUTPUT INVERTOR

[75] Inventor: Masahiko Kashimura, Tokyo, Japan

[73] Assignee: NEC Corporation, Tokyo, Japan

[21] Appl. No.: 901,688

[22] Filed: Jun. 22, 1992

[30] Foreign Application Priority Data

Jun. 27, 1991 [JP] Japan .................. 3-183096

[51] Int. Cl.$^5$ .................. G11C 7/00; G11C 11/40
[52] U.S. Cl. .................. 365/189.01; 365/189.09; 365/203
[58] Field of Search ........... 365/203, 189.09, 189.01

[56] References Cited

U.S. PATENT DOCUMENTS 4,843,594 6/1989 Tanaka et al. .................. 365/189.09
5,001,668 3/1991 Ito et al. .................. 365/189.09

FOREIGN PATENT DOCUMENTS 1-251499 10/1989 Japan .

*Primary Examiner*—Eugene R. LaRoche
*Assistant Examiner*—Viet Q. Nguyen
*Attorney, Agent, or Firm*—Sughrue, Mion, Zinn, Macpeak & Seas

[57] ABSTRACT

A read only memory device memorizes data bits by selectively providing current paths of n-channel enhancement type memory transistors between digit lines and a ground voltage line, and one of the digit lines is coupled through an n-channel enhancement type transfer transistor of a column selector unit with a drain node of a charging transistor responsive to a control signal, wherein the charging transistor is implemented by an n-channel enhancement type field effect transistor so that the drain node thereof is balanced with the selected digit line upon completion of a precharging phase, thereby preventing an output inverting circuit coupled therewith from malfunction due to noise on the selected digit line.

10 Claims, 7 Drawing Sheets

READ ONLY MEMORY DEVICE WITH RECHARGING TRANSISTOR AUTOMATICALLY SUPPLEMENTING CURRENT TO AN INPUT NODE OF OUTPUT INVERTOR

FIELD OF THE INVENTION

This invention relates to a read only memory device and, more particularly, to a precharging transistor for digit lines.

DESCRIPTION OF THE RELATED ART

A typical example of the read only memory device is illustrated in FIG. 1 of the drawings, and comprises a memory cell array 1, a column selector unit 2, a p-channel enhancement type charging transistor 3 and an output inverting circuit 4. The memory cell array 1 has a plurality of addressable cell locations CL11, CL1n, CL21, CL2n, CLm1, CLmn, and is associated with a plurality of word lines WL1, WL2 and WLm and with a plurality of digit lines DL1, DL2 and DLn. The word lines WL1 to WLm and the digit lines DL1 to DLn define the plurality of addressable memory locations CL11 to CLmn, and n-channel enhancement type memory transistors Qn11, Qn12 and Qn13 are selectively assigned to the cell locations CL11 to CLmn. The word lines WL1 to WLm are coupled with a row address decoder 5, and the row address decoder 5 is responsive to row address bits so that one of the word lines WL1 to WLm goes up to active high voltage level. If the selected word line is coupled to a gate electrode of an n-channel enhancement type memory transistor, the n-channel enhancement type memory transistor turns on, and a current path is provided from the associated digit line to a ground voltage line. However, if any n-channel enhancement type memory transistor is not coupled with the selected word line, the digit lines DL1 to DLn are isolated from the ground voltage line.

The column selector unit 2 is implemented by a plurality of n-channel enhancement type transfer transistors Qn21, Qn22 and Qn2n, and the n-channel enhancement type transfer transistors Qn21 to Qn2n are provided in association with the digit lines DL1 to DLn. Namely, the n-channel enhancement type transfer transistors Qn21 to Qn2n are coupled with the digit lines DL1 to DLn, and are selectively gated by a column address decoder unit 6. The column selector unit 2 is further coupled with the p-channel enhancement type charging transistor 3, and the p-channel enhancement type charging transistor 3 is responsive to a control signal CB so as to supply current from a power voltage line Vcc to the column selector unit 2. If a cell location selected by a word line provides a current path from the selected digit line to the ground voltage line, the current passes through the column selector unit 2 and the current path in the selected cell location, and the voltage level at the drain node N1 of the p-channel enhancement type charging transistor 3 goes down. However, if any current path is established in the selected cell location, the voltage level at the drain node N1 of the p-channel enhancement type charging transistor 3 is maintained in the high voltage level.

The output inverting circuit 4 is implemented by a series combination of a p-channel enhancement type field effect transistor Qp41 and an n-channel enhancement type field effect transistor Qn42 coupled between the power voltage line Vcc and the ground voltage line, and the drain node N1 of the p-channel enhancement type charging transistor 3 is coupled with the gate electrode of the p-channel enhancement type field effect transistor Qp41 and the gate electrode of the n-channel enhancement type field effect transistor Qn42. The common drain node N2 in the series combination is coupled with a data output pin DT, and an output data signal Dout is supplied from the output inverting circuit 4 to the data output pin DT.

The prior art read only memory device thus arranged behaves as follows. FIG. 2 illustrates a read-out sequence of the prior art read only memory device, and the cell location CL21 is assumed to be accessed twice after access to the cell location CL11. The control signal CB is decayed to low voltage level at time t1, and the power voltage line Vcc is coupled with the digit line DL1 through the p-channel enhancement type charging transistor 3 and the n-channel enhancement type transfer transistor Qn21 already selected by the column address decoder unit 6. Since all of the word lines WL1 to WLm are decayed to the low voltage level substantially concurrently with the control signal CB, the drain node N1 is elevated to the power voltage level Vcc, and the digit line DL1 is lifted to an intermediate voltage level V1 lower than the power voltage level Vcc by the threshold level thereof. The drain node N1 of the power voltage level Vcc causes the n-channel enhancement type field effect transistor Qn42 to turn on, and the p-channel enhancement type field effect transistor Qp41 turns off. Then, the common drain node N2 is coupled through the n-channel enhancement type field effect transistor Qn42 with the ground voltage line, and the output data signal Dout goes down to the ground voltage level at time t2. The control signal CB is recovered to the power voltage level Vcc at time t3, and the p-channel enhancement type charging transistor 3 turns off. The row address bits causes the row address decoder unit 5 to lift the word line WL1 upon recovery of the control signal CB, and the n-channel enhancement type memory transistor Qn11 turns on to provide the current path from the associated digit line DL1 to the ground voltage line. Current flows from the digit line DL1 to the ground voltage line, and the digit line DL1 is decayed toward the ground voltage level. The digit line DL1 thus decayed allows the n-channel enhancement type transfer transistor Qn21 to turn on, and, accordingly, the drain node N1 goes down toward the ground voltage level. Since the parasitic capacitance coupled with the drain node N1 is much smaller than that coupled with the digit line DL1, the drain node N1 initially goes down at high speed, and, thereafter, is slowly decayed together with the digit line DL1 depending upon the current driving capability of the n-channel enhancement type memory transistor Qn11. Then, the output inverting circuit 4 couples the power voltage line Vcc through the p-channel enhancement type field effect transistor Qp41 with the common drain node N2, and this results in the output data signal Dout of the high voltage level.

After the digit line DL1 and the drain node N1 reach the ground voltage level, the control signal CB goes down at time t5, and the drain node N1 and the digit line DL1 are precharged as similar to the access to the cell location CL11. The word line WL2 goes up at time t6; however, both of the digit line DL1 and the drain node N1 are kept at the respective voltage level V1 and Vcc, because any current path is not provided from the digit line DL1 to the ground voltage line. The drain node N1 at the power voltage level Vcc causes the output inverting circuit 4 to couple the common drain node N2 through the n-channel enhancement type field effect transistor Qn42 with the ground voltage line, and the output data signal Dout remains in the low or ground voltage level.

If the cell location CL21 is accessed again, the control signal CB goes down to the ground voltage level at time t7, and the digit line DL1 and the drain node N1 are precharged again as similar to the previous access. The control signal CB is recovered to the high voltage level at time t8, and the word line WL2 goes up upon recovery of the control signal CB. However, if noise takes place on the ground voltage line at time t9, the voltage level on the digit line DL1 fluctuates due to the noise, because most of the parasitic capacitance is coupled between the digit line DL1 and the ground voltage line. A read only memory device usually internally has various noise sources, and the noise sources are causative of the voltage fluctuation. If the voltage fluctuation on the digit line DL1 produces differential voltage level between the drain node and the gate electrode of the n-channel enhancement type transfer transistor Qn21 larger than the threshold level thereof, the n-channel enhancement type transfer transistor Qn21 turns on, and the drain node N1 is rapidly decayed, because the parasitic capacitance coupled with the drain node N1 is much smaller than that of the digit line DL1. However, when the noise is removed from the ground voltage line, the digit line DL1 is recovered to the high voltage level V1, and the n-channel enhancement type transfer transistor Qn21 turns off. For this reason, the drain node N1 is confined at the voltage level lower than the threshold level of the output inverting circuit 4, and the output data signal Dout goes up to a high voltage level.

Thus, the prior art read only memory device is susceptible to noise on the ground voltage line, and such a low noise margin deteriorates the reliability of the output data signal Dout.

SUMMARY OF THE INVENTION

It is therefore an important object of the present invention to provide a read only memory device which is less susceptible to noise so as to enhance the reliability of the output data signal.

To accomplish the object, the present invention proposes to decrease differential voltage level between a precharging level at an input node of an output inverting circuit and a precharging level on a digit line.

In accordance with the present invention, there is provided a read only memory device comprising: a) a memory cell array having a plurality of addressable cell locations arranged in rows and columns, enhancement type memory transistors of a first channel conductivity type being assigned to cell locations selected from the plurality of addressable cell locations; b) a plurality of word lines respectively associated with the rows of the addressable cell locations, and coupled with the gate electrodes of the enhancement type memory transistors of the associated rows, respectively, so that one of the rows is selected from the memory cell array; c) a plurality of digit lines respectively associated with the columns of the addressable cell locations, and connectable with a first constant voltage line through the enhancement type memory transistors in the aforesaid one of the rows selected from the memory cell array; d) a column selector unit having a common node, and a plurality of enhancement type transfer transistors of the first channel conductivity type coupled between the plurality of digit lines and the common node, one of the plurality of enhancement type transfer transistors turning on so as to couple the associated digit line with the common node; e) an enhancement type charging transistor of the first channel conductivity type responsive to a control signal for coupling a second constant voltage line different in voltage level from the first constant voltage line with the common node, and operative to charge the common node lower than the voltage level on the second constant voltage line; f) an output inverting circuit implemented by a series combination of a first enhancement type switching transistor of a second channel conductivity type opposite to the first channel conductivity type and a second enhancement type switching transistor of the first channel conductivity type coupled between the first and second constant voltage lines, one of the first and second enhancement type switching transistors being gated by the common node; and g) a constant voltage generating unit coupled with the gate electrode of the other of the first and second enhancement type switching transistors.

BRIEF DESCRIPTION OF THE DRAWINGS

The features and advantages of the read only memory device according to the present invention will be more clearly understood from the following description taken in conjunction with the accompanying drawings in which.

DESCRIPTION OF THE PREFERRED EMBODIMENTS

First Embodiment

Figure 1:
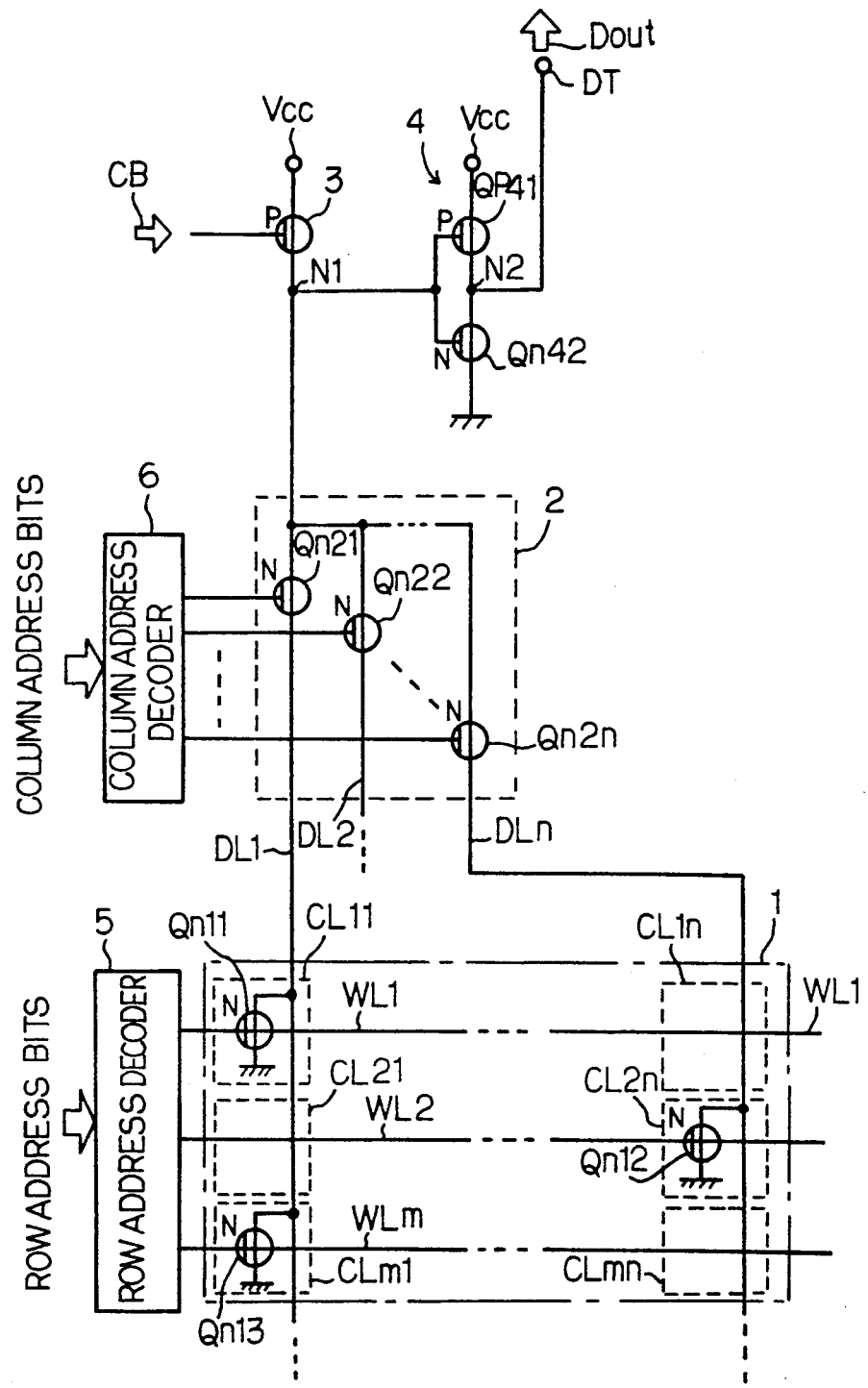
FIG. 1 is a circuit diagram showing the circuit arrangement of the prior art read only memory device.
Figure 2:
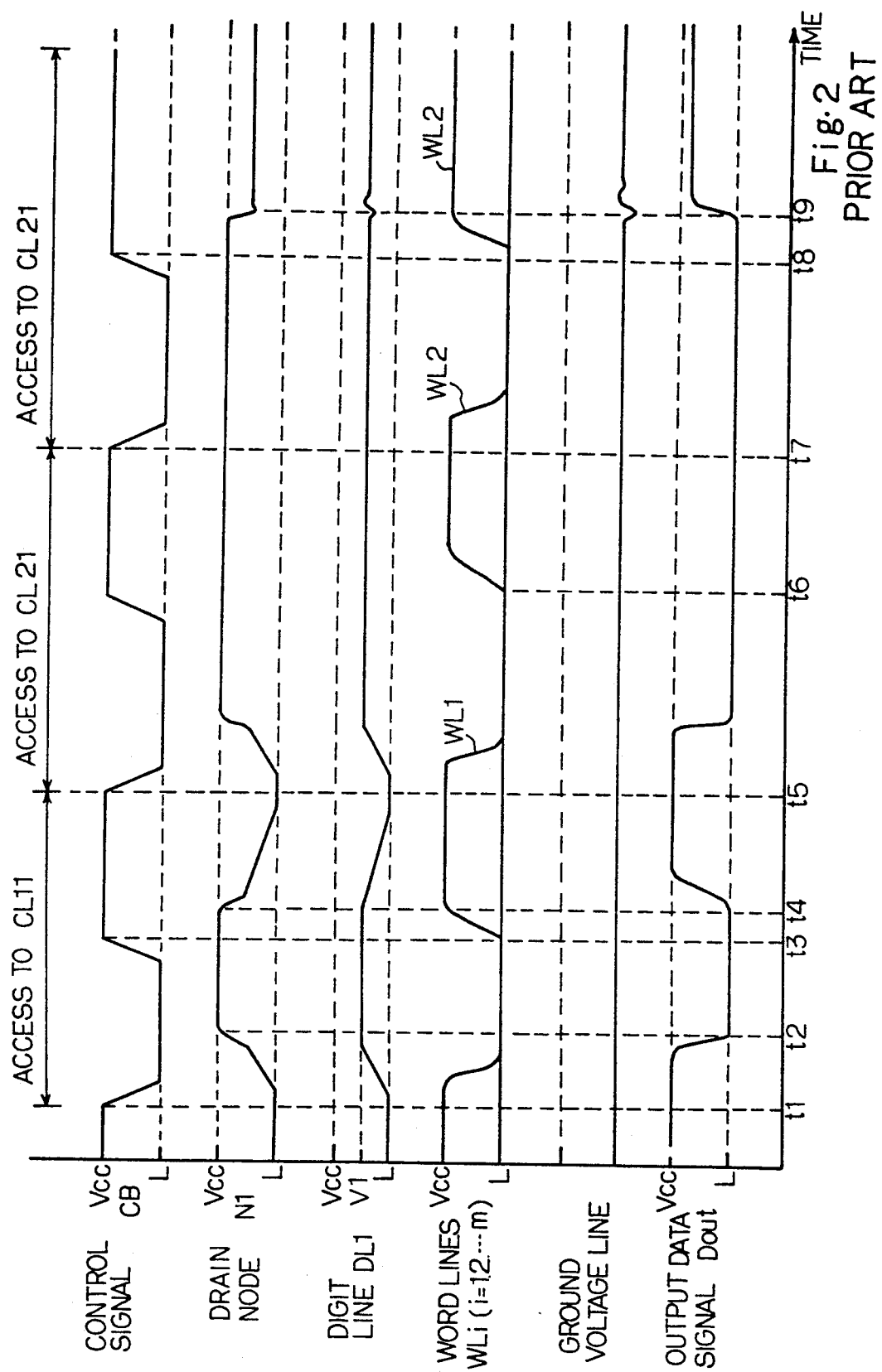
FIG. 2 is a diagram showing the waveforms of voltage levels at essential nodes of the prior art read only memory device.
Figure 3:
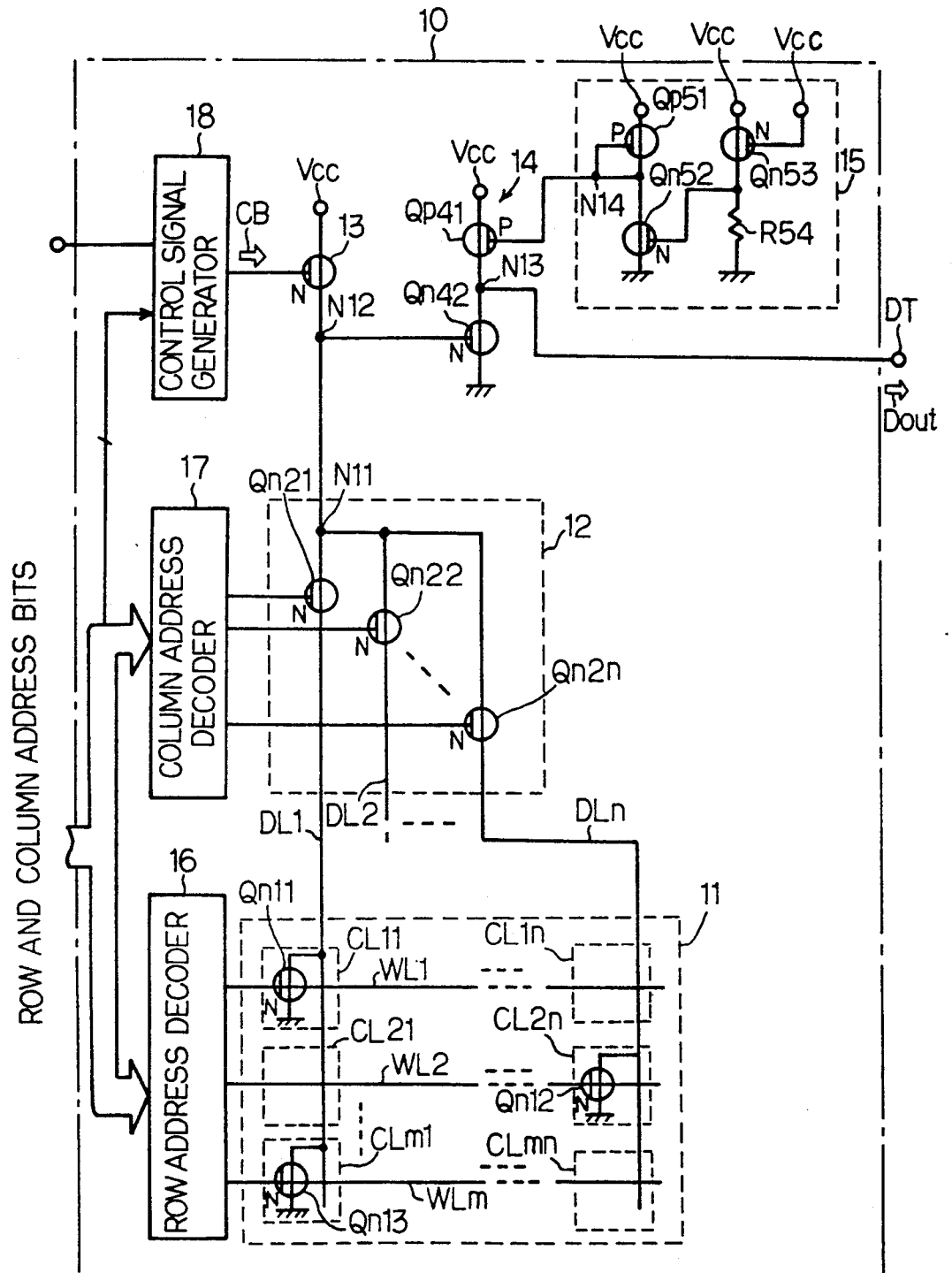
FIG. 3 is a circuit diagram showing the circuit arrangement of a read only memory device according to the present invention.

Referring to FIG. 3 of the drawings, a read only memory device embodying the present invention is fabricated on a single semiconductor chip 10, and comprises a memory cell array 11, a column selector unit 12, an n-channel enhancement type charging transistor 13, an output inverting circuit 14, and a constant voltage producing circuit 15. The memory cell array 11 has a plurality of addressable cell locations CL11, CL1n, CL21, CL2n, CLm1, CLmn, and is associated with a plurality of word lines WL1, WL2 and WLm and with a plurality of digit lines DL1, DL2 and DLn. The word lines WL1 to WLm and the digit lines DL1 to DLn define the plurality of addressable memory locations CL11 to CLmn, and n-channel enhancement type memory transistors Qn11, Qn12 and Qn13 are selectively assigned to the cell locations CL11 to CLmn. The word lines WL1 to WLm are coupled with a row address decoder 16, and the row address decoder 16 is responsive to row address bits so that one of the word lines WL1 to WLm goes up to active high voltage level. If the selected word line is coupled to a gate electrode of an n-channel enhancement type memory transistor, the n-channel enhancement type memory transistor turns on, and a current path is provided from the associated digit line to a ground voltage line. However, if any n-channel enhancement type memory transistor is not coupled with the selected word line, the digit lines DL1 to DLn are isolated from the ground voltage line.

The column selector unit 12 is implemented by a plurality of n-channel enhancement type transfer transistors Qn21, Qn22 and Qn2n, and the n-channel enhancement type transfer transistors Qn21 to Qn2n are provided in association with the digit lines DL1 to DLn. Namely, the n-channel enhancement type transfer transistors Qn21 to Qn2n are coupled between the associated digit lines DL1 to DLn and a common node N11, and are selectively gated by a column address decoder unit 17. The column selector unit 12 is further coupled with the n-channel enhancement type charging transistor 13, and the n-channel enhancement type charging transistor 13 is responsive to a control signal CB supplied from a control signal generator 18 so as to supply current from a power voltage line Vcc to the column selector unit 12. One of the differences from the prior art read only memory device is the channel conductivity type of the charging transistor 13, and the voltage level at the drain node thereof N12 is lower than that of the prior art upon completion of the precharging phase. If a cell location selected by a word line provides a current path from the selected digit line to the ground voltage line, the current flows from the n-channel enhancement type charging transistor 13 through the column selector unit 12 and the current path in the selected cell location, and the voltage level at the drain node N12 of the n-channel enhancement type charging transistor 13 goes down. However, if any current path is established in the selected cell location, the voltage level at the drain node N12 of the n-channel enhancement type charging transistor 13 is maintained in the high voltage level.

The output inverting circuit 14 is implemented by a series combination of a p-channel enhancement type field effect transistor Qp41 and an n-channel enhancement type field effect transistor Qn42 coupled between the power voltage line Vcc and the ground voltage line, and the drain node N12 of the n-channel enhancement type charging transistor 13 is coupled with the gate electrode of the n-channel enhancement type field effect transistor Qn42 only. The connection between the drain node N12 and the output inverting circuit 14 is another difference from the prior art read only memory device. The gate electrode of the p-channel enhancement type field effect transistor Qp41 is coupled with the output node N14 of the constant voltage generating circuit 15. For this reason, the p-channel enhancement type field effect transistor Qp41 serves as a load element. The common drain node N13 in the series combination is coupled with a data output pin DT, and an output data signal Dout is supplied from the output inverting circuit 14 to the data output pin DT.

The constant voltage generating circuit 15 comprises a series combination of a p-channel enhancement type load transistor Qp51 and an n-channel enhancement type load transistor Qn52 coupled between the power voltage line Vcc and the ground voltage line, and a series combination of an n-channel enhancement type load transistor Qn53 and a resistive element R54 also coupled between the power voltage line Vcc and the ground voltage line. The gate electrode of the n-channel enhancement type load transistor Qn53 is coupled with the power voltage line Vcc, and produces a constant step-down voltage level at the drain node thereof. The gate electrode of the p-channel enhancement type load transistor Qp51 is coupled with the output node N14 of the constant voltage generating circuit 15, and the drain node of the n-channel enhancement type load transistor Qn53 is coupled with the gate electrode of the n-channel enhancement type load transistor Qn52. The n-channel enhancement type load transistor Qn52 provides constant channel resistance against current passing therethrough, and keeps the voltage level at the output node N14 constant in cooperation with the p-channel enhancement type load transistor Qp51.

Figure 4:
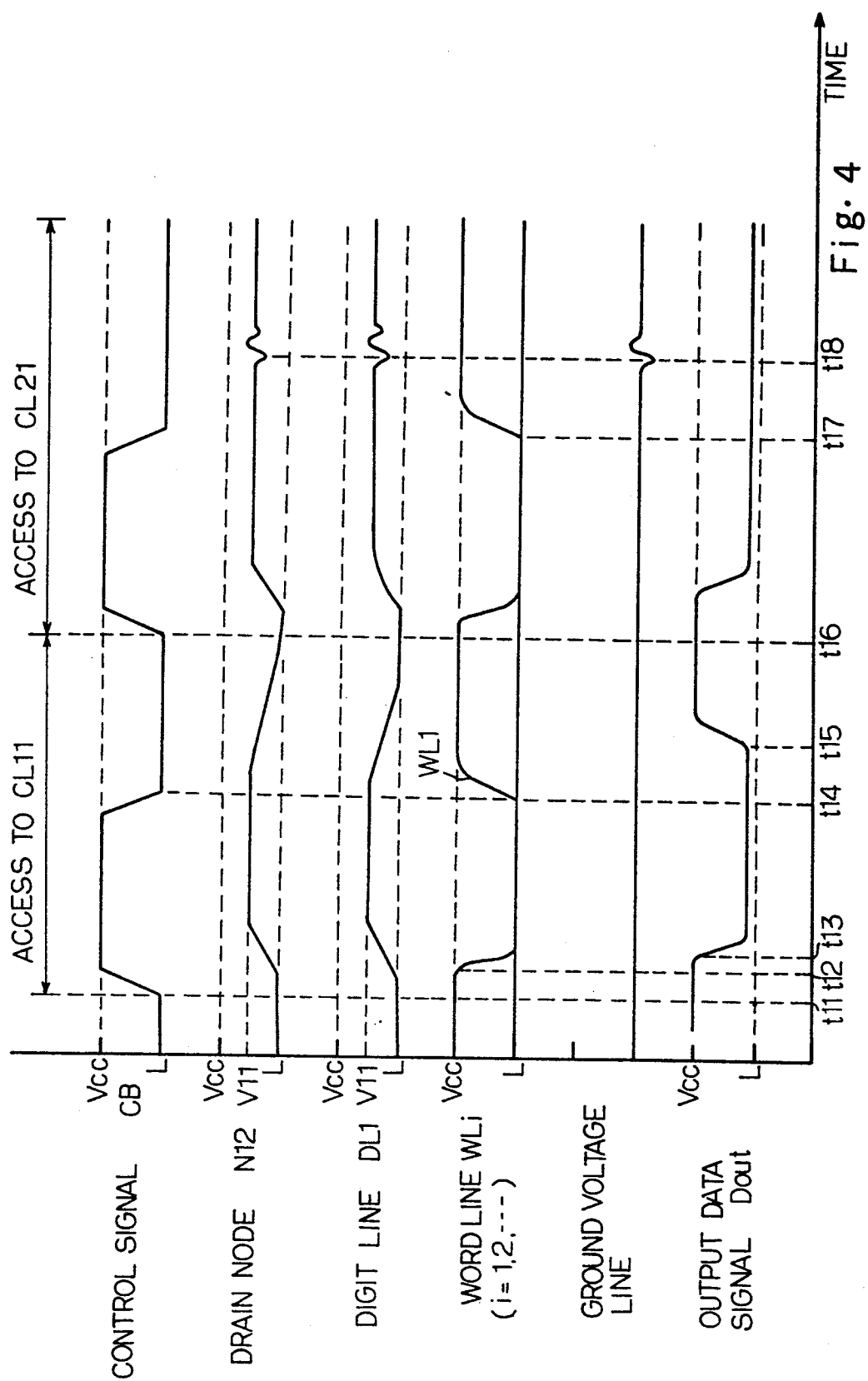
FIG. 4 is a diagram showing the waveforms of essential nodes of the read only memory device shown in FIG. 3.

The read only memory device thus arranged behaves as follows. FIG. 4 illustrates a read-out sequence of the prior art read only memory device, and the cell locations CL11 and CL21 are assumed to be sequentially accessed in the read-out sequence. The control signal CB is lifted to the power voltage level Vcc at time t11, and the n-channel enhancement type charging transistor 13 turns on so that the drain node N12 and, accordingly, the common node N11 are coupled with the power voltage line Vcc. Since the n-channel enhancement type transfer transistor Qn21 has turned on, the power voltage line Vcc is further coupled with the digit line DL1 through the n-channel enhancement type transfer transistor Qn21.

All of the word lines WL1 to WLm are decayed to the low voltage level at time t12. However, the control signal CB remains in the power voltage level. Then, the drain node N12 and, accordingly, the common node N11 go up to a predetermined intermediate voltage level V11 lower than the power voltage level Vcc by the threshold level of the charging transistor 13. Since the n-channel enhancement type transfer transistor Qn21 is approximately equal in threshold level to the n-channel enhancement type charging transistor 13, the digit line DL1 is also lifted to the predetermined intermediate voltage level V11, and is balanced with the drain node N12. Thus, the difference between the drain node N12 and the selected digit line DL1 is minimized in this instance. The drain node N12 of the predetermined intermediate voltage level V11 causes the n-channel enhancement type field effect transistor Qn42 to turn on, and the common drain node N13 is coupled through the n-channel enhancement type field effect transistor Qn42 with the ground voltage line. For this reason, the output data signal Dout goes down to the low voltage level at time t13.

The control signal CB is recovered to the low or ground voltage level at time t14, and the n-channel enhancement type charging transistor 13 turns off. The row address bits causes the row address decoder unit 16 to lift the word line wL1 upon recovery of the control signal CB, and the n-channel enhancement type memory transistor Qn11 turns on to provide the current path from the associated digit line DL1 to the ground voltage line. Current flows from the digit line DL1 to the ground voltage line, and the digit line DL1 is decayed toward the ground voltage level. The digit line DL1 thus decayed allows the n-channel enhancement type transfer transistor Qn21 to turn on, and, accordingly, the drain node N12 goes down toward the ground voltage level. Since the drain node N12 has been balanced with the digit line DL1, the digit line DL1 and the drain node N12 are slowly decayed, and the current driving capability of the n-channel enhancement type memory transistor Qn11 dominates the speed. Then, the output inverting circuit 14 couples the power voltage line Vcc through the p-channel enhancement type field effect transistor Qp41 with the common drain node N13, and this results in the output data signal Dout of the high voltage level at time t15.

After the digit line DL1 and the drain node N12 reach the ground voltage level, the control signal CB goes up at time t16, and the drain node N12 and the digit line DL1 are precharged to the predetermined intermediate voltage level V11 as similar to the access to the cell location CL11. The word line WL2 goes up at time t17; however, both of the digit line DL1 and the drain node N12 are kept at the predetermined intermediate voltage level V11, because any current path is not provided from the digit line DL1 to the ground voltage line. The drain node N12 at the predetermined intermediate voltage level V11 causes the output inverting circuit 14 to couple the common drain node N13 through the n-channel enhancement type field effect transistor Qn42 with the ground voltage line, and the output data signal Dout remains in the low voltage level.

If noise takes place on the ground voltage line at time t18, the voltage level on the digit line DL1 fluctuates due to the noise. However, the difference between the drain node N12 and the digit line DL1 has been balanced with one another, and the fluctuation on the digit line DL1 is less causative of fluctuation in voltage level at the drain node N12. In other words, the drain node N12 does not widely swing the voltage level, and, for this reason, the output inverting circuit 14 keeps the output data signal Dout in the low voltage level.

As will be understood from the foregoing description, the difference in voltage level between the drain node N12 and the selected digit line DL1 is minimized upon completion of the precharging phase, and noise on the digit line DL1 has merely small influence on the voltage level at the drain node N12. For this reason, the output inverting circuit 14 maintains the output data signal Dout, and the reliability is enhanced.

Second Embodiment

Figure 5:
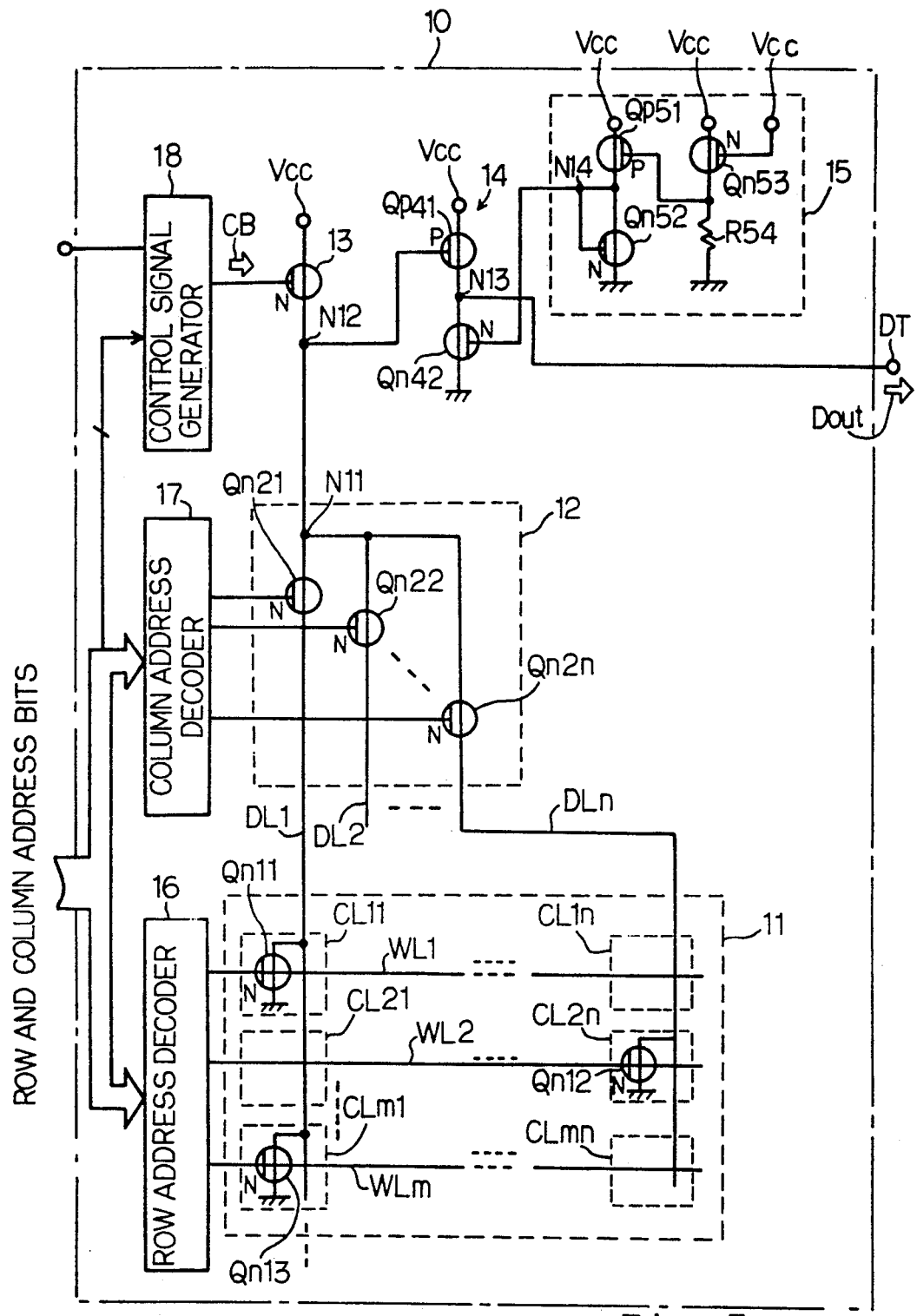
FIG. 5 is a circuit diagram showing the circuit arrangement of another read only memory device according to the present invention.

Turning to FIG. 5 of the drawings, another read only memory device embodying the present invention is illustrated, and the circuit components thereof are similar to those of the first embodiment except for connections between the drain node N12, the output inverting circuit 14 and the constant voltage generating circuit 15. For this reason, the component elements of the second embodiment are labeled with the same references as the first embodiment.

In the second embodiment, the drain node N12 of the n-channel enhancement type charging transistor is coupled with the gate electrode of the p-channel enhancement type load transistor Qp41, and the output node N14 of the constant voltage generating circuit 15 is coupled with the gate electrode of the n-channel enhancement type load transistor Qn42. Thus, the connections are exchanged, and the connections between the circuit components Qp51 and Qn52 are modified in accordance therewith.

Since the drain node N12 is coupled with the gate electrode of the n-channel enhancement type field effect transistor Qn42 in the first embodiment, the output inverting circuit 14 becomes responsive to the voltage level V12 at the drain node N12 when the following equation is satisfied.

$$V12 = Vcc - Vtn' > Vth42 \qquad \text{Equation 1}$$

where Vth42 is the threshold level of the n-channel enhancement type field effect transistor Qn42, and Vth' is the threshold level of the n-channel enhancement type charging transistor 13 in which the back gate biasing effect is taken into account. However, in the second embodiment, there is possibility to swing until a larger one between the threshold level Vth42 and the absolute value of the threshold level of the p-channel enhancement type field effect transistor Qp41. Of course, it is better to give a margin in view of stability of the circuit behavior. However, all of the advantages of the first embodiment are also achieved by the second embodiment.

Third Embodiment

Figure 6:
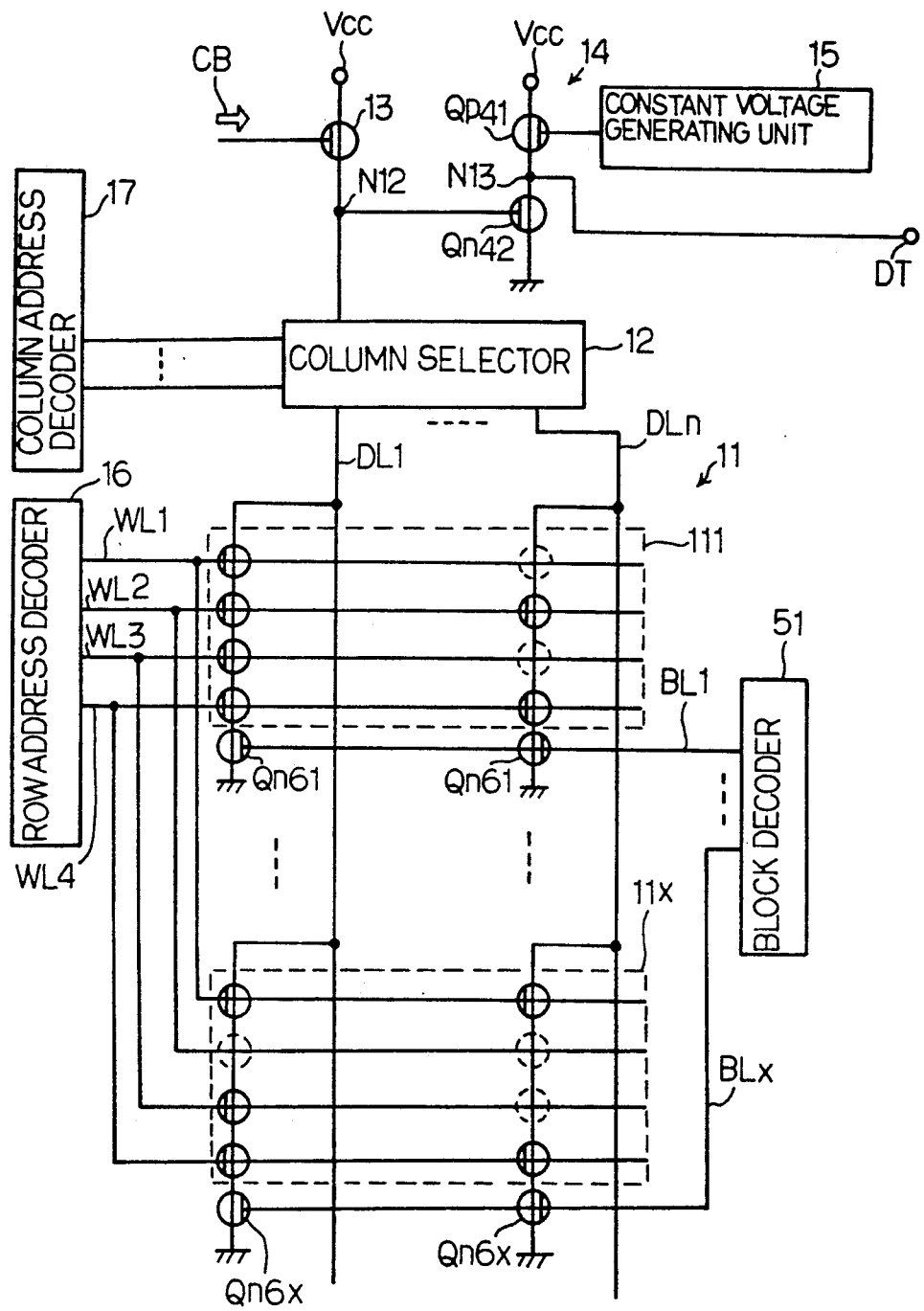
FIG. 6 is a circuit diagram showing the circuit arrangement of yet another read only memory device according to the present invention.

Turning to FIG. 6 of the drawings, yet another read only memory device embodying the present invention is illustrated. The read only memory device implementing the third embodiment is similar to the first embodiment except for the memory cell array 11 associated with a block decoder 51 as well as n-channel enhancement type selecting transistors Qn61 to Qn6x, and, for this reason, circuit components are labeled with the same references as those designating the corresponding circuit components of the first embodiment. The memory cell array 11 is broken down into a plurality of memory cell sub-arrays 111 to 11x, and the word lines WL1 to WL4 and digit lines DL1 to DLn are shared between the memory cell sub-arrays 111 to 11x. The block decoder 51 is coupled through decoded signal lines BL1 to BLx with the n-channel enhancement type selecting transistors Qn61 to Qn6x, and selects one of the memory cell sub-arrays 111 to 11x from the memory cell array 11. However, the other circuit components behave on the selected memory cell sub-array as similar to those of the first embodiment, and no further description is incorporated hereinbelow.

Figure 7:
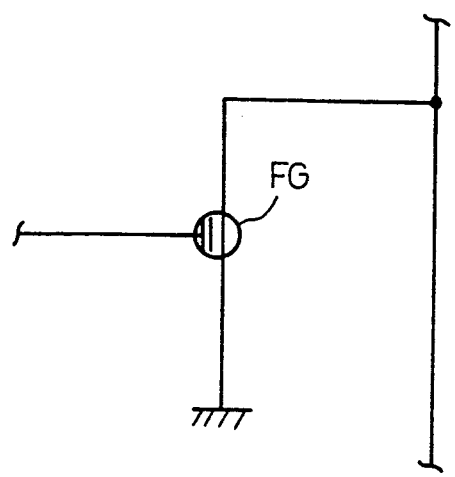
FIG. 7 is a circuit diagram showing a floating gate type field effect transistor used for a memory cell instead of an enhancement type field effect transistor incorporated in the embodiments.

Although particular embodiments of the present invention have been shown and described, it will be obvious to those skilled in the art that various changes and modifications may be made without departing from the spirit and scope of the present invention. For example, a boosted power voltage level may be supplied to some circuit components for enhancing the stability of circuit behavior. Moreover, the read only memory device may be incorporated in an ultra large scale integration such as, for example, a microprocessor or a semi-custom made integrated circuit device. Moreover, the memory cell arrays 11 of the first to third embodiments are implemented by n-channel enhancement type memory transistors. However, a memory cell array incorporated in a read only memory device according to the present invention may be implemented by a plurality of floating gate type field effect transistors FG each having the structure shown in FIG. 7. The floating gate type field effect transistors FG allows the read only memory device to serve as an electrically programmable read only memory device or as an electrically erasable and programmable read only memory device.

What is claimed is:

1. A read only memory device comprising:
   a) a memory cell array having a plurality of addressable cell locations arranged in rows and columns, enhancement type memory transistors of a first channel conductivity type being assigned to cell locations selected from said plurality of addressable cell locations;
   b) a plurality of word lines respectively associated with said rows of said addressable cell locations, and coupled with the gate electrodes of said enhancement type memory transistors of said associated rows, respectively, so that one of said rows is selected from said memory cell array;
   c) a plurality of digit lines respectively associated with said columns of said addressable cell locations, and connectable with a first constant voltage line through said enhancement type memory transistors in said one of said rows selected from said memory cell array;
   d) a column selector unit having a common node, and a plurality of enhancement type transfer transistors of said first channel conductivity type coupled between said plurality of digit lines and said common node, one of said plurality of enhancement type transfer transistors turning on so as to couple the associated digit line with said common node;
   e) an enhancement type charging transistor of said first channel conductivity type responsive to a control signal for coupling a second constant voltage line different in voltage level from said first constant voltage line with said common node, and operative to charge said common node with a voltage level lower than the voltage level on said second constant voltage line;
   f) an output inverting circuit implemented by a series combination of a first enhancement type switching transistor of a second channel conductivity type opposite to said first channel conductivity type and a second enhancement type switching transistor of said first channel conductivity type coupled between said first and second constant voltage lines, one of said first and second enhancement type switching transistors being gated by said common node; and
   g) a constant voltage generating unit coupled with the gate electrode of the other of said first and second enhancement type switching transistors.

2. A read only memory device as set forth in claim 1, in which said first channel conductivity type is achieved by n-type impurity atoms, and said second channel conductivity type is achieved by doping p-type impurity atoms.

3. A read only memory device as set forth in claim 2, in which said second enhancement type switching transistor of the n-channel conductivity type is gated by said common node, and the gate electrode of said first enhancement type switching transistor of the p-channel conductivity type is coupled with said constant voltage generating unit.

4. A read only memory device as set forth in claim 2, in which the gate electrode of said second enhancement type switching transistor of the n-channel conductivity type is coupled with said constant voltage generating unit, and said first enhancement type switching transistor of the p-channel conductivity type is gated by said common node.

5. A read only memory device as set forth in claim 2, in which said constant voltage generating unit comprises a series combination of a p-channel enhancement type first load transistor and an n-channel enhancement type second load transistor coupled between said first and second constant voltage lines, and a series combination of an n-channel enhancement type third load transistor and a resistive element coupled between said first and second constant voltage lines, a gate electrode of said p-channel enhancement type first load transistor being coupled with a common drain node of said p-channel enhancement type first load transistor and said n-channel enhancement type second load transistor, a gate electrode of said n-channel enhancement type second load transistor being coupled with a drain node of said n-channel enhancement type third load transistor, a gate electrode of said n-channel enhancement type third load transistor being coupled with said second constant voltage line.

6. A read only memory device as set forth in claim 2, in which said constant voltage generating unit comprises a series combination of a p-channel enhancement type first load transistor and an n-channel enhancement type second load transistor coupled between said first and second constant voltage lines, and a series combination of an n-channel enhancement type third load transistor and a resistive element coupled between said first and second constant voltage lines, a gate electrode of said p-channel enhancement type first load transistor being coupled with a drain node of said n-channel enhancement type third load transistor, a gate electrode of said n-channel enhancement type second load transistor being coupled with a common drain node of said p-channel enhancement type first load transistor and said n-channel enhancement type second load transistor, a gate electrode of said n-channel enhancement type third load transistor being coupled with said second constant voltage line.

7. A read only memory device as set forth in claim 1, in which said memory cell array serves as one of memory cell sub-arrays selected by a block decoder unit.

8. A read only memory device as set forth in claim 1, in which each of said enhancement type memory transistors is implemented by a floating gate type field effect transistor in erased state.

9. A read only memory device as set forth in claim 8, in which said memory cell array allows said read only memory device to serve as an electrically programmable read only memory device.

10. A read only memory device as set forth in claim 8, in which said memory cell array allows said read only memory device to serve as an electrically erasable and programmable read only memory device.

* * * * *